(12) United States Patent
Sakamoto et al.

(10) Patent No.: US 8,744,676 B2
(45) Date of Patent: Jun. 3, 2014

(54) DISCHARGE ABILITY ESTIMATING SYSTEM, CONTROL SYSTEM IN VEHICLE INCORPORATING DISCHARGE ABILITY ESTIMATING SYSTEM, AND DISCHARGE ABILITY ESTIMATING METHOD

(75) Inventors: Takuya Sakamoto, Akashi (JP);
Tatsuya Hirokami, Osaka (JP);
Yoshimoto Matsuda, Kobe (JP);
Mitsushiro Fujimoto, Kakogawa (JP)

(73) Assignee: Kuwasaki Jukogyo Kabushiki Kaisha, Kobe-shi (JP)

( * ) Notice: Subject to any disclaimer, the term of this patent is extended or adjusted under 35 U.S.C. 154(b) by 0 days.

(21) Appl. No.: 13/554,974

(22) Filed: Jul. 20, 2012

(65) Prior Publication Data
US 2013/0024069 A1    Jan. 24, 2013

(30) Foreign Application Priority Data
Jul. 21, 2011 (JP) .................................. 2011-159554

(51) Int. Cl.
*B60L 11/00* (2006.01)
(52) U.S. Cl.
USPC .............................. 701/36; 701/22; 320/127
(58) Field of Classification Search
USPC ........ 701/22, 36, 29.1, FOR. 100, FOR. 102, 701/29, 31; 123/179.1, 179.28; 320/2, 41, 320/124, 125, 127; 324/426
See application file for complete search history.

(56) References Cited

U.S. PATENT DOCUMENTS

| | | | |
|---|---|---|---|
| 2006/0036357 A1* | 2/2006 | Isono et al. ...................... 701/22 |
| 2007/0138998 A1* | 6/2007 | Togashi et al. ................ 320/104 |
| 2009/0025467 A1* | 1/2009 | Suzuki et al. ............... 73/114.15 |
| 2009/0282903 A1* | 11/2009 | Nagano et al. ............. 73/114.15 |
| 2010/0268441 A1* | 10/2010 | Yoshiume ...................... 701/103 |
| 2011/0288706 A1* | 11/2011 | Okamura ........................ 701/22 |
| 2012/0101708 A1* | 4/2012 | Hirai et al. .................... 701/103 |

FOREIGN PATENT DOCUMENTS

| | | | |
|---|---|---|---|
| JP | 2009114939 | | 5/2009 |
| JP | 2010007503 A | * | 1/2010 |

* cited by examiner

*Primary Examiner* — Mary Cheung
*Assistant Examiner* — Rodney Butler
(74) *Attorney, Agent, or Firm* — Alleman Hall McCoy Russell & Tuttle LLP

(57) ABSTRACT

There is provided a discharge ability estimating system for estimating a discharge ability of a battery for supplying electric power to an electric motor which rotates a crankshaft of an engine to start the engine, the system being configured to estimate the discharge ability of a battery based on an angular acceleration state of the crankshaft in a rotation starting period of the crankshaft.

18 Claims, 7 Drawing Sheets

DISCHARGE ABILITY ESTIMATING SYSTEM, CONTROL SYSTEM IN VEHICLE INCORPORATING DISCHARGE ABILITY ESTIMATING SYSTEM, AND DISCHARGE ABILITY ESTIMATING METHOD

BACKGROUND OF THE INVENTION

1. Field of the Invention

The present invention relates to a discharge ability estimating system for estimating a discharge ability of a battery for supplying electric power to an electric motor which rotates a crankshaft of an engine to start the engine, an idling system incorporating the discharge ability estimating system, an electric device starting system including the discharge ability estimating system, and a discharge ability estimating method.

2. Description of the Related Art

Some vehicles including engines, such as a motorcycle, employ a technique for stopping idling during a stopped state. In this technique, when the vehicle stops driving, running of the engine is stopped, and thereafter a starter motor is actuated automatically to start the engine when the vehicle resumes driving. In this technique, since the starter motor starts the engine repeatedly, an electric power consumption amount of the battery is greater in this vehicle than a vehicle which continues to be idle during a stopped state. Therefore, it is more likely that electric power charged in the battery runs out, and as a result, the engine cannot be started. To avoid this, it is desirable to estimate a discharge ability of the battery. The discharge ability of the battery can be estimated based on an internal resistance of the battery, a maximum discharge current amount of the battery, and a voltage of the battery at a current (present) time. As a method of deriving the maximum discharge current amount, there is a method of detecting the maximum discharge current amount by a sensor, and a method of estimating the maximum discharge current amount like an in-vehicle battery state estimating system disclosed in Japanese Patent NO. 4459997.

To detect the maximum discharge current amount of the battery by using a sensor, the sensor is required to measure the maximum discharge current amount with higher accuracy. Such a highly accurate sensor is very expensive, and is undesirable in terms of cost saving. As a solution to this, Japanese Patent No. 4459997 discloses that the maximum discharge current amount of the battery is estimated based on the internal resistance of the battery. However, polarization may occur after the battery stops discharging, and this causes the calculated internal resistance to be lower than an original internal resistance of the battery. The polarization tends to be diminished with a passage of time after the battery stops discharging. Therefore, it is difficult to accurately know influence of the polarization.

SUMMARY OF THE INVENTION

The present invention addresses the above stated conditions, and an object of the present invention is to provide a discharge ability estimating system capable of estimating a discharge ability of a battery without directly measuring or estimating an internal resistance or a maximum discharge current amount of the battery, a control system in a vehicle incorporating the discharge ability estimating system, and a discharge ability estimating method.

According to an aspect of the present invention, there is provided a discharge ability estimating system for estimating a discharge ability of a battery for supplying electric power to an electric motor which rotates a crankshaft of an engine to start the engine; comprising: the discharge ability estimating system being configured to estimate the discharge ability of the battery based on an angular acceleration state of the crankshaft in a rotation starting period of the crankshaft.

In accordance with the present invention, the angular acceleration state of the crankshaft during starting of the engine corresponds to a way in which a current flows during starting of the electric motor. Therefore, by detecting the angular acceleration state of the crankshaft in an initial period of starting of the engine, the discharge ability (dischargeable current) of the battery during starting of the engine can be estimated. This makes it possible to estimate the discharge ability of the battery without directly measuring or estimating a great current such as an inrush current during starting of the electric motor. Since the discharge ability is estimated based on the angular acceleration state of the crankshaft, it can be determined whether or not the engine can actually be started in view of friction applied to a piston, an engine temperature, an outside air temperature, etc., as well as the discharge ability of the battery.

The angular acceleration state may be calculated based on a detection signal of a rotational angle sensor for detecting a rotational angle of the crankshaft.

Since the discharge ability of the battery can be estimated by calculating the angular acceleration state based on the detection signal from the rotational angle sensor. As the rotational angle sensor, an existing rotational speed sensor for detecting the engine speed can be used. This can reduce the number of component parts in number and hence manufacturing cost.

Compensation may be made for the estimated discharge ability of the battery based on an engine temperature or an outside air temperature.

Since cranking torque of the engine changes depending on a change in the engine temperature or the outside air temperature, a relationship between the angular acceleration state of the crankshaft and the discharge ability of the battery changes, depending on the change in the engine temperature or the outside air temperature. In accordance with the above configuration, since compensation can be made for the estimated discharge ability of the battery based on the engine temperature or the outside air temperature, the discharge ability of the battery can be estimated accurately while eliminating the influences of the engine temperature or the outside air temperature.

The discharge ability of the battery may be estimated based on at least one of a maximum value and a minimum value of a value corresponding to a current or voltage supplied from the battery to the electric motor, the value corresponding to the current or the voltage being in a second time period except for a first time period just after the electric motor starts during cranking of the engine.

Since a rate of change in the corresponding value in the second time period with a passage of a time is less than a rate of a change in the corresponding value in the first time period with a passage of a time, an extreme value error of the corresponding value can be diminished, and the discharge ability of the battery can be estimated accurately, without reducing a detection period to excess.

The discharge ability of the battery may be estimated based on a difference between the maximum value and the minimum value of the value corresponding to the current or voltage in the second time period.

In accordance with this configuration, since the influence of the polarization of the battery, or the like is cancelled, a difference between maximum torque and minimum torque of the electric motor, which are generated in the second time period, can be estimated. This difference corresponds to an acceleration force of the crankshaft during pumping and changes depending on the discharge ability of the battery. By estimating the discharge ability based on the difference, the discharge ability and degradation of the battery can be estimated accurately.

Compensation may be made for the estimated discharge ability of the battery.

The discharge ability of the battery changes depending on the battery temperature. In accordance with the above configuration, since compensation is made for the estimated discharge ability of the battery based on the battery temperature, the discharge ability of the battery can be estimated accurately while eliminating the influence of the battery temperature.

According to another aspect of the present invention, there is provided a control system in a vehicle comprising: the above stated discharge ability estimating system; an actuation determiner system for determining whether or not the electric motor can actuate the crankshaft by the electric power supplied from the battery, based on a result of estimation performed by the discharge ability estimating system; an electric generator for generating electric power by rotation of the crankshaft and supplies the electric power to the battery; and an actuation control system which causes the engine to stop the rotation of the crankshaft during a stopped state of the vehicle, if it is determined that the crankshaft can be actuated, and causes the electric generator to supply the electric power to the battery without stopping the rotation of the crankshaft during the stopped state if it is determined that the crankshaft cannot be actuated.

In accordance with this configuration, it is possible to prevent the engine from failing to start using the electric motor after the crankshaft stops in the engine.

According to another aspect of the present invention, there is provided a control system in a vehicle comprising: the above stated discharge ability estimating system; an actuation determiner system for determining whether or not an electric device can be actuated by the electric power supplied from the battery, based on a result of estimation performed by the discharge ability estimating system; and an actuation control system which actuates the electric device if it is determined that the electric device can be actuated, and does not actuate the electric device if it is determined that the electric device cannot be actuated.

In accordance with this configuration, when the discharge ability of the battery is low, it is possible to avoid a situation in which the electric device is actuated and consumes the electric power of the battery. Therefore, the electric device will not consume the electric power of the battery up to an extent in which the electric motor cannot start.

The actuation determiner system may compare the result of estimation performed by the discharge ability estimating system to a predetermined actuation determination criterion, to determine whether or not the electric device can be actuated, and makes compensation for the actuation determination criterion based on the battery temperature.

An actuation permission condition of the electric motor changes depending on the battery temperature. In accordance with the above configuration, since compensation is made for the actuation determination criterion based on the battery temperature, the influence of the battery temperature can be eliminated. Thus, it is possible to avoid a situation in which the electric motor fails to be actuated depending on the battery temperature.

According to another aspect of the present invention, there is provided a discharge ability estimating method for estimating a discharge ability of a battery for supplying electric power to an electric motor which rotates a crankshaft of an engine to start the engine; comprising: estimating the discharge ability of a battery based on an angular acceleration state of the crankshaft in a rotation starting period of the crankshaft. In accordance with this method, the discharge ability of the battery can be estimated without directly measuring or estimating the internal resistance of the battery and a maximum discharge current amount of the battery.

The above and further objects and features of the invention will more fully be apparent from the following detailed description with reference to the accompanying drawings.

DETAILED DESCRIPTION OF THE PREFERRED EMBODIMENTS

Hereinafter, a motorcycle 1 including an engine ECU 40 which is a discharge ability estimating system according to an embodiment of the present invention will be described with reference to the drawings. The stated directions are referenced from a perspective of a driver straddling the motorcycle 1.

Figure 1:
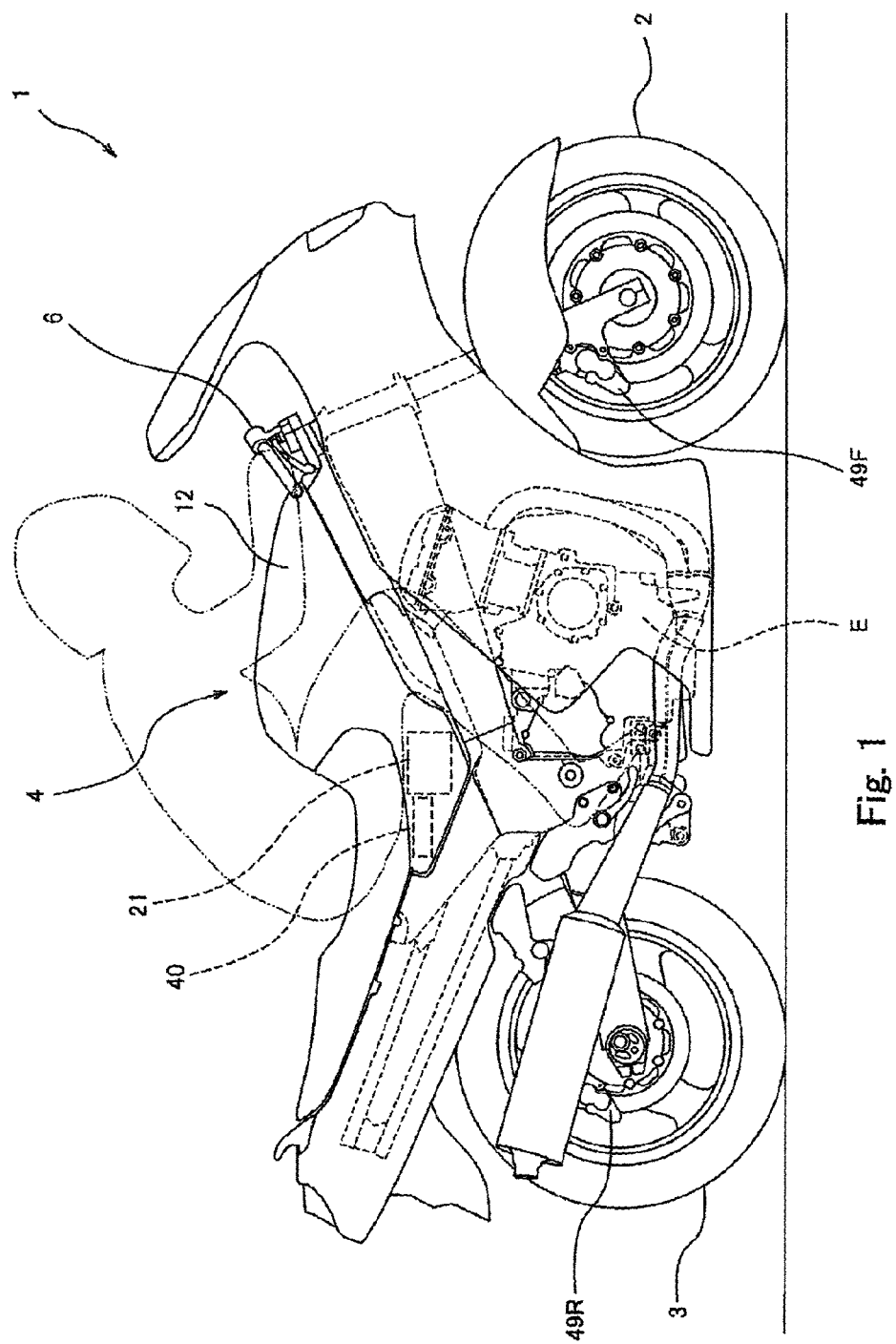
FIG. 1 is a right side view showing a motorcycle including an engine ECU according to an embodiment of the present invention.
Figure 2:
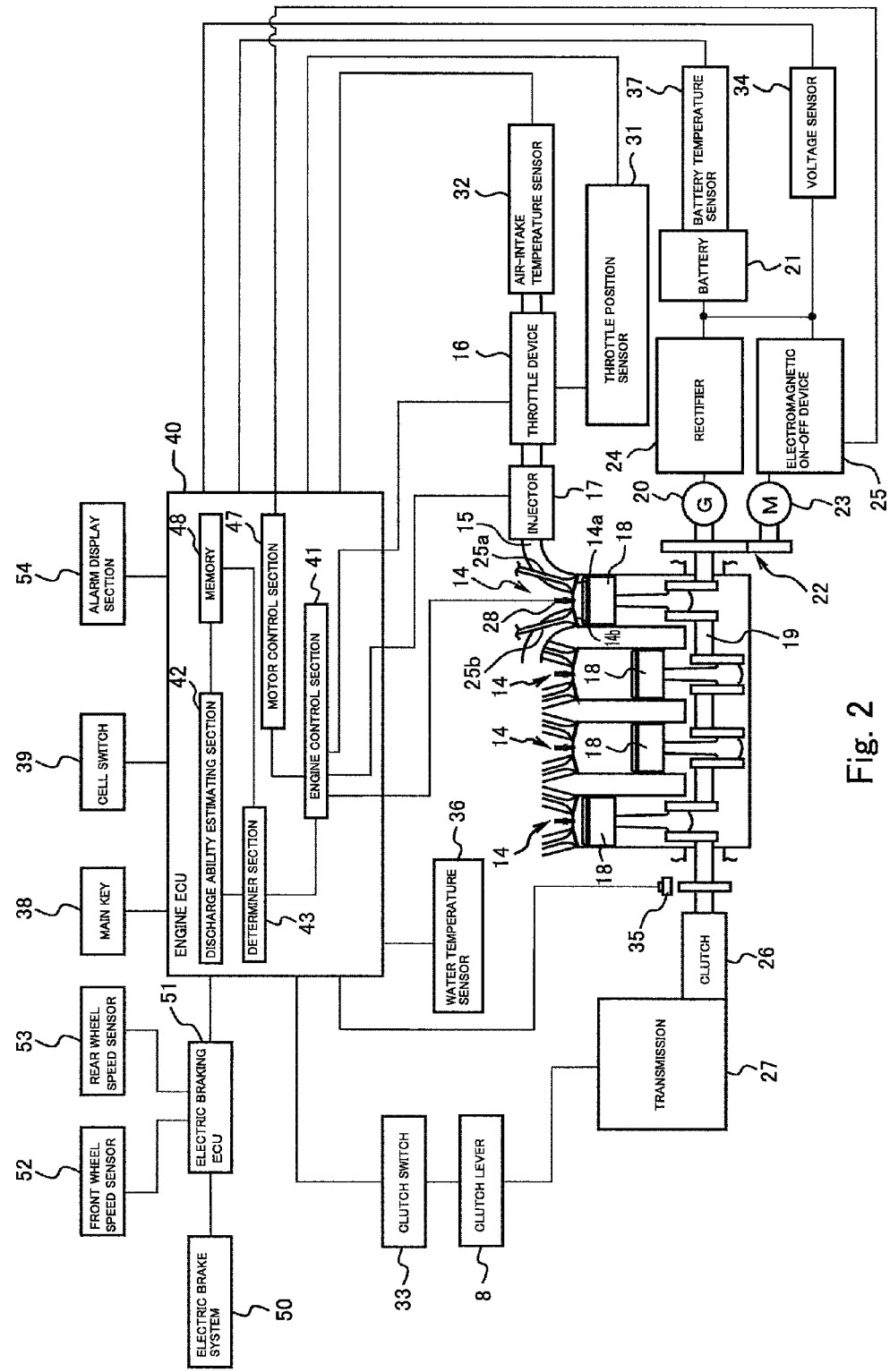
FIG. 2 is a block diagram showing a control system incorporated in the motorcycle of FIG. 1.

Turning now to FIG. 1, the motorcycle 1 includes a vehicle body 4 which can be straddled by the driver. A front wheel 2 is rotatably mounted to a front portion of the vehicle body 4, and a rear wheel 3 is rotatably mounted to a rear portion of the vehicle body 4. A bar-type steering handle 6 is positioned on a front upper portion of the vehicle body 4. An engine E is mounted to an intermediate portion of the vehicle body 4 in a forward and rearward direction. As shown in FIG. 2, the engine E has four cylinders 14. Each cylinder 14 is provided with an intake port 14a and an exhaust port 14b. An air intake passage 15 is coupled to the intake port 14a. The air intake passage 15 is coupled to an air cleaner (not shown) disposed below the fuel tank 12. The air intake passage 15 is configured to take in air from outside by utilizing ram air pressure from forward of the vehicle during travel. An air intake temperature sensor 32, a throttle device 16, and an injector 17, which will be described later, are attached on the air intake passage 15 and positioned downstream of the air cleaner. The throttle device 16 adjusts an amount of intake air supplied to the engine E via the air intake passage 15. The injector 17 injects a fuel to the air flowing in the air intake passage 15, to generate an air-fuel mixture. The air-fuel mixture is suctioned into the cylinder 14 via the intake port 14a.

A tip end portion of a piston 18 is reciprocatingly inserted into the cylinder 14. A base end portion of the piston 18 is coupled to a crankshaft 19. According to a rotation of the crankshaft 19, the piston 18 reciprocates inside the cylinder 14. The crankshaft 19 extends in a rightward and leftward direction. A generator 20 is mounted to one end portion of the crankshaft 19. The generator 20, which is an electric generator, is electrically coupled to a battery 21 via a rectifier circuit 24. The generator 20 generates electric power by rotation of the crankshaft 19. The rectifier circuit 24 converts AC power generated in the generator 20 into DC power which is charged (stored) into the battery 21.

A starter motor 23 (hereinafter also referred to as motor 23) is coupled to one end portion of the crankshaft 19 via a gear train 22. The motor 23, which is an electric motor, is electrically coupled to the battery 21 via an electromagnetic on-off device 25. The electromagnetic on-off device 25 is configured to open and close an electric circuit between the battery 21 and the motor 23. When the electric circuit between the battery 21 and the motor 23 is closed, the DC power discharged from the battery 21 is supplied to the motor 23. Thus, the motor 23 rotates the crankshaft 19.

The engine E configured as described above is a four-cycle engine. When the crankshaft 19 rotates and the piston 18 moves downward, an intake valve 25a moves to open the intake port 14a, and the air-fuel mixture is suctioned into the cylinder 14 (intake stroke). Thereafter, when the crankshaft 19 rotates and the piston 18 moves upward, the intake valve 25a closes the intake port 14a and the air-fuel mixture in the cylinder 14 is compressed (compression stroke). After the compression stroke, an ignition device 28 combusts the compressed air-fuel mixture to forcibly move down the piston 18, thereby rotating the crankshaft 19 (expansion or explosion stroke). When the crankshaft 19 further rotates and the piston 18 moves upward, an exhaust valve 25b moves to open the exhaust port 14b (exhaust stroke). In the exhaust stroke, exhaust gas is emitted to atmosphere via an exhaust pipe and a muffler. As described above, the piston 18 goes through the intake stroke, the compression stroke, the expansion stroke and the exhaust stroke in a predetermined order. During the expansion stroke, any of the pistons 18 corresponding to the four cylinders 14 rotates the crankshaft 19.

A transmission 27 is coupled to the opposite end portion of the crankshaft 19 via a clutch mechanism 26. The transmission 27 reduces the rotational speed of the crankshaft 19 with a reduction gear ratio corresponding to a transmission gear position set in the transmission 27 and outputs the resulting rotation. The output (driving power) of the transmission 27 is transmitted to the rear wheel 3 via a transmission mechanism (not shown) such as a chain. The clutch mechanism 26 is configured to mechanically connect or disconnect the crankshaft 19 to or from the transmission 27, in response to the driver's operation of a clutch lever 8 provided at the left portion of a steering handle 6. The clutch mechanism 26 is used to mechanically disconnect the crankshaft 19 and the transmission 27 from each other when a gear ratio is changed.

The engine E and the transmission 27 are attached with various sensors. Specifically, a throttle position sensor 31 is attached on the throttle device 16 to detect a position (opening degree) of a throttle valve. An air intake temperature sensor 32 is attached on the air cleaner (not shown) to detect an air intake temperature. A clutch switch 33 is attached on the clutch lever 8 to detect whether or not the clutch lever 8 has been operated by the driver. A crank angle sensor 35 (engine speed sensor) is attached on the crankshaft 19 to detect the rotational angle (engine speed) of the crankshaft 19. A water temperature sensor 36 is attached on the engine E to detect a cooling water temperature of the engine E. The water temperature sensor 36 is configured to measure the temperature of cooling water flowing in the interior of the engine E, to thereby indirectly detect the temperature of the engine E. A battery temperature sensor 37 and a voltage sensor 34 are attached on the battery 21. The battery temperature sensor 37 detects a temperature of the battery 21. A voltage sensor 34 detects a voltage discharged by the battery 21.

The above stated sensors 31 to 37 are electrically coupled to an engine ECU 40, which is an engine control system. A main switch 38 and a cell switch 39 are electrically coupled to the engine ECU 40. The main switch 38 is turned ON or OFF to supply electric power to an electric system in the motorcycle 1 and stop electric power supply to the electric system. The cell switch 39 is turned ON to provide a command for starting the engine E. An alarm display device 54 is coupled to the engine ECU 40 and configured to display alarm messages.

The engine ECU 40 having functions of a discharge ability estimating system, a starting determination system, and an operation control system, is configured to control the operation of the engine E based on the detection signals from the sensors 31 to 37 and the commands from the switches 38 and 39. In addition, the engine ECU 40 is configured to estimate a discharge ability of the battery 21 by a discharge ability estimating method such as will be described later. Specifically, the engine ECU 40 fundamentally includes an engine control section 41, a discharge ability estimating section 42, and an idling stop determiner section 43.

The engine control section 41 is electrically coupled to the throttle device 16, the ignition device 28 and the injector 17, and is configured to control the operation of the throttle device 16, the operation of the ignition device 28, and the operation of the injector 17, based on detection signals from the sensors 31, 35, and others. The engine control section 41 is electrically coupled to a motor control section 47. The motor control section 47 is configured to actuate the electromagnetic on-off device 25 to rotate the motor 23 based on the command from the engine control section 41.

The discharge ability estimating section 42 is configured to estimate the discharge ability of the battery 21 based on the detection signals from the crank angle sensor 35 and the voltage sensor 34, and make compensation for the estimated discharge ability based on the detection signals from the water temperature sensor 36 and the battery temperature sensor 37. Furthermore, the discharge ability estimating section 42 is configured to estimate a discharge amount or a charge amount of the battery 21 based on an electric power consumption amount and charge amount per unit time, corresponding to each operation pattern (start of driving, driving, idling stop, etc.) pre-stored in the memory 48. The idling stop determiner section 43 is configured to determine whether or not the discharge ability of the battery 21 exceeds a threshold (shifting inhibiting threshold or badness threshold as will be described later) pre-stored in the memory 48 based on the estimated discharge ability for which compensation has been made by the discharge ability estimating section 42. For example, the idling stop determiner section 43 is configured to determine whether or not the battery 21 can supply to the motor 23, electric power for rotating the crankshaft 19 to start the engine E.

The motorcycle 1 includes an electric brake system 50 capable of adjusting a brake force applied by a hydraulic brake mechanism 49F (FIG. 1) provided in the front wheel 2 and a brake force applied by a hydraulic brake mechanism 49R (FIG. 1) provided in the rear wheel 3. The electric brake system 50, which is an electric device, may be, for example, an anti-lock brake system or an interlocking brake system. The electric brake system 50 is configured in such a manner that a braking motor (not shown) is supplied with the electric power from the battery 21 and actuates a hydraulic pump. Hydraulic oil discharged from the hydraulic pump is fed to the brake mechanism via a hydraulic circuit to actuate the brake mechanism. The hydraulic circuit causes a plurality of electromagnetic valves (not shown) contained therein to adjust a pressure of the hydraulic oil fed to the brake mechanism, and hence the brake force applied to the front wheel 2 and the brake force applied to the rear wheel 3.

The electric brake system 50 configured as described above is electrically coupled to an electric braking ECU 51. A front wheel speed sensor 52 and a rear wheel speed sensor 53 are coupled to the electric braking ECU 51 which is a driving control system. The electric brake system 50 is configured to control the operation of the braking motor and the plurality of valves in the electric brake system 50 based on the detection signals from the sensors 52, 53. The electric braking ECU 51 is electrically coupled to the engine ECU 40.

[Discharge Ability Estimating Method]

Figure 3:
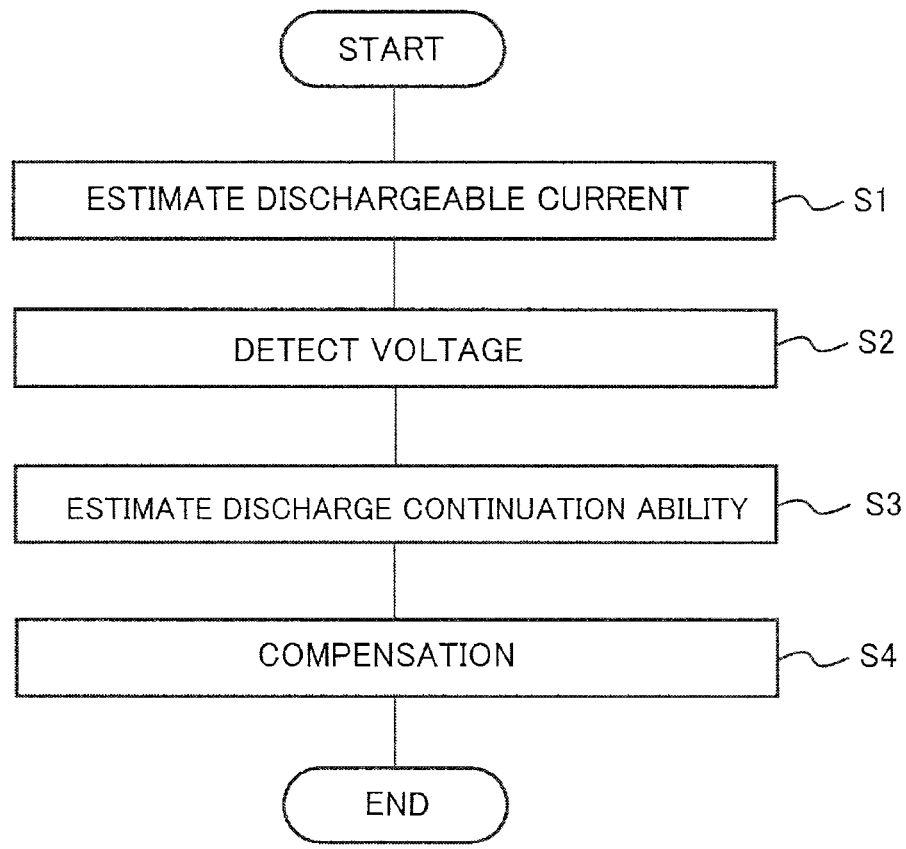
FIG. 3 is a flowchart showing a procedure of a discharge ability estimating method of a battery which is executed by the engine ECU of FIG. 1.

In the engine ECU 40 having the above described configuration, as described above, the discharge ability estimating section 42 is configured to estimate the discharge ability of the battery 21. Hereinafter, the discharge ability estimating method by the discharge ability estimating section 42 will be described with reference to flowchart of FIG. 3 and graph of FIG. 4.

When the engine ECU 40 provides a motor start command to the motor 23, i.e., allows the motor 23 to be applied with a current, in step S1 (dischargeable current estimating step), the discharge ability estimating method is initiated. In step S1, initially, an angular acceleration state of the crankshaft 19 in a rotation starting period is calculated. The rotation starting period is defined as a predetermined period immediately from when the crankshaft 19 starts (i.e., immediately after the engine ECU 40 provides the motor starting command to the motor 23) until the crankshaft 10 actually rotates by the driving power of the engine E (i.e., fuel is ignited). The angular acceleration state of the crankshaft 19 is represented by a rotation time required for the crankshaft 19 to be displaced between two angular positions. The rotation time is calculated based on the detection signal from the crank angle sensor 35. The discharge ability estimating section 42 starts measurement of time, from a time point when the crankshaft 19 has rotated to a first predetermined angle α, and calculates a time t required from when the crankshaft 19 has reached the first angle α until the crankshaft 19 has rotated to a second predetermined angle β.

During the rotation starting period, ignition and combustion do not occur in the engine E yet. Because of this, the angular acceleration state of the crankshaft 19 during the rotation starting period corresponds to only torque generated in the motor 23. The torque generated in the motor 23 corresponds to a discharge current of the battery 21. The angular acceleration state of the crankshaft 19 in an initial period of the rotation starting period corresponds to the discharge current of the battery 21 in the initial period of the rotation starting period. Therefore, by calculating the angular acceleration state of the crankshaft 19 in an initial period of the rotation starting period, a dischargeable current which is one of the discharge abilities of the battery 21 during starting of the engine E can be estimated. It is estimated that the discharge ability is higher when the angular acceleration state of the crankshaft 19, which as described above may be a rotation time required for the crankshaft 19 to be displaced between two angular positions, is smaller, i.e., the angular acceleration is higher. This makes it possible to estimate the discharge ability of the battery 21 without directly measuring or estimating a great current such as an inrush current of the battery 21. In addition, the discharge ability of the battery 21 can be estimated by calculating the angular acceleration state of the crankshaft 19 based on the detection signal from the crank angle sensor 35 (may be an existing crank angle sensor) used to detect the engine speed of the engine E. Therefore, the number of components can be lessened, and manufacturing costs can be reduced. After the angular acceleration state is calculated and the discharge ability is estimated, the process moves to step S2 (voltage detecting step).

In step S2, the engine ECU 40 calculates a minimum voltage and a maximum voltage of the voltage discharged by the battery 21 based on the detection signal from the voltage sensor 34. To be in greater detail, the engine ECU 40 calculates a minimum voltage and a maximum voltage in the time period T2 before ignition (second time period) (see FIG. 4) except for a starting time period (first time period) T1 (see FIG. 4) immediately after the starting of the motor 23, when the engine E is cranking. The starting time period T1 which is the first time period is defined as a time period from when the inrush current is applied to the motor 23 (see time t2 in FIG. 4) until the discharge voltage discharged by the battery 21 firstly changes from increasing to decreasing (time t3 in FIG. 4). The time period T2 before ignition which is the second time period is defined as a time period from when the discharge voltage firstly changes from increasing to decreasing (time t3 in FIG. 4) until the ignition device 28 is activated to ignite the air-fuel mixture (time t4 in FIG. 4). In the present embodiment, the time period T2 before ignition is defined as a time period from when the discharge voltage firstly changes from increasing to decreasing until the crankshaft 19 has rotated up to a predetermined rotational number (or predetermined angle). The predetermined rotational number is an arbitrary rotational number from when a supply voltage firstly changes from increasing to decreasing until the fuel starts to be ignited. The predetermined rotational number preferably includes at least one compression stroke and at least one expansion stroke of the piston 18. In the four-cycle engine, for example, the predetermined rotational number is preferably one or more rotations. After the engine ECU 40 detects the minimum voltage and the maximum voltage, the process moves to step S3 (discharge continuation ability estimating step).

In step S3, a difference between the minimum voltage detected in step S2 and the maximum voltage detected in step S2 is calculated. By deriving the difference between the minimum voltage and the maximum voltage, the polarization of the battery 21, or the like, can be cancelled. The discharge voltage before ignition corresponds to the discharge current of the battery 21, i.e., torque of the motor 23. When the voltage becomes minimum, the torque of the motor 23 becomes maximum, while when the voltage becomes maximum, the torque of the motor 23 becomes minimum. That is, a voltage difference corresponds to a difference (hereinafter referred to as torque difference) between the minimum torque and the maximum torque of the motor 23. The torque difference is the torque of the motor 23 which is required to allow the piston 18 to perform pumping.

The motor 23 causes the piston 18 to reciprocate against a friction applied to the piston 18. Therefore, the torque difference of the motor 23 required to allow the piston 18 to perform pumping during starting is substantially constant. However, the voltage difference fluctuates. This is because the discharge ability of the battery 21 decreases because of, for example, an increase in the internal resistance of the battery 21, due to excess discharge or degradation of the battery 21. The voltage difference increases as the excess discharge or degradation of the battery 21 progresses over time. If the voltage difference increases, the crankshaft 19 cannot continue to be rotated under the state in which the battery 21 maintains a predetermined voltage discharge state. Therefore, by calculating an inverse number (reciprocal number) of the voltage difference, a discharge continuation ability (indicator indicating whether or not the crankshaft 19 can continue to rotate under the state in which the battery 21 maintains the predetermined voltage discharge state), which is one of the discharge abilities of the battery 21, can be estimated. In this way, the state (excess discharge or degradation) of the battery 21 can be estimated.

As described above, the discharge continuation ability is calculated based on a change in the voltage in the time period T2 before ignition. A rate of a change in the voltage during the time period T2 before ignition is less than a rate of a change in the voltage during the starting time period T1. Therefore, an error of an extreme value of the voltage difference can be diminished without a need to reduce a detection period to excess. Therefore, the discharge ability of the battery 21 can be estimated accurately. Although in the present embodiment, the discharge continuation ability is estimated based on the difference between the maximum voltage and the minimum voltage, the discharge continuation ability may be estimated based on a difference between a minimum current and a maximum current discharged by the battery 21. After the voltage difference is calculated, the process moves to step S4 (compensation step).

In step S4, the discharge ability estimating section 42 makes compensation for the estimated dischargeable current based on the detection signals from the air intake temperature sensor 32, the water temperature sensor 36 and the battery temperature sensor 37. In the engine E, a mechanical resistance to the crankshaft 19 fluctuates due to an outside air temperature and an engine temperature. Therefore, a correspondence between the angular acceleration state of the motor 23 and the estimated dischargeable current of the battery 21 changes. Therefore, by making compensation for the estimated dischargeable current of the battery 21 based on the engine temperature, the outside air temperature, etc., the dischargeable current which is closer to an original discharge ability of the battery 21 can be derived while eliminating environmental influences.

In a case where the engine temperature is low or the outside air temperature is low, the above stated mechanical resistance to the crankshaft 19 increases, which is found out from an experiment or theoretical analysis. To be specific, when the engine temperature is low, a viscosity resistance of a lubricant increases. In a case where the outside air temperature is low, a pumping loss increases and the mechanical resistance increases. When the mechanical resistance increases, the angular acceleration of the crankshaft 19 decreases, and the estimated dischargeable current of the battery 21 is less than the original discharge ability of the battery 21. In view of this, when the engine temperature or the outside air temperature is low, the discharge ability estimating section 42 makes compensation for the estimated dischargeable current such that the estimated dischargeable current is greater. On the other hand, in a case where a battery temperature is lower than a predetermined temperature (to be specific, zero degrees C.), the dischargeable current is less than that in a case where the battery temperature is equal to or higher than the predetermined temperature. The dischargeable current is restored when the battery temperature becomes equal to or higher than the predetermined temperature. In view of this, when the battery temperature is lower than the predetermined temperature, the discharge ability estimating section 42 makes compensation for the estimated dischargeable current such that the estimated dischargeable current is greater.

In step S4, the discharge ability estimating section 42 makes compensation for the discharge continuation ability calculated in step S3. Specifically, the discharge ability estimating section 42 makes compensation for the discharge continuation ability of the battery 21 based on the detection signals from the air intake temperature sensor 32, the water temperature sensor 36 and the battery temperature sensor 37. In this way, the discharge continuation ability of the battery 21 is estimated such that the influences of the environments are eliminated. After the compensation, the discharge ability estimating method terminates.

As described above, since the dischargeable current of the battery 21 is estimated based on the angular acceleration state of the crankshaft 19, it can be confirmed whether or not the engine E can actually be started, in view of a friction applied to the piston 18, the engine temperature, the outside temperature, etc. In addition, in the discharge ability estimating method, two different discharge abilities, i.e., dischargeable current and discharge continuation ability of the battery 21, are estimated by different calculation processes, and the discharge ability of the battery 21 can be estimated accurately by using the two discharge abilities.

[Idling Stop Method]

The engine ECU 40 for estimating the discharge ability has an idling stop function for stopping the idling of the engine E during a stopped state of the motorcycle 1. The engine ECU 40 performs (activates) the idling stop function when an idling stop condition is met, as will be described later. The engine ECU 40 deactivates the idling stop function according to the discharge ability of the battery 21. Hereinafter, the idling stop method using the dischargeable current which is one of the discharge abilities of the battery 21 will be described with reference to FIGS. 3 to 5.

Figure 4:
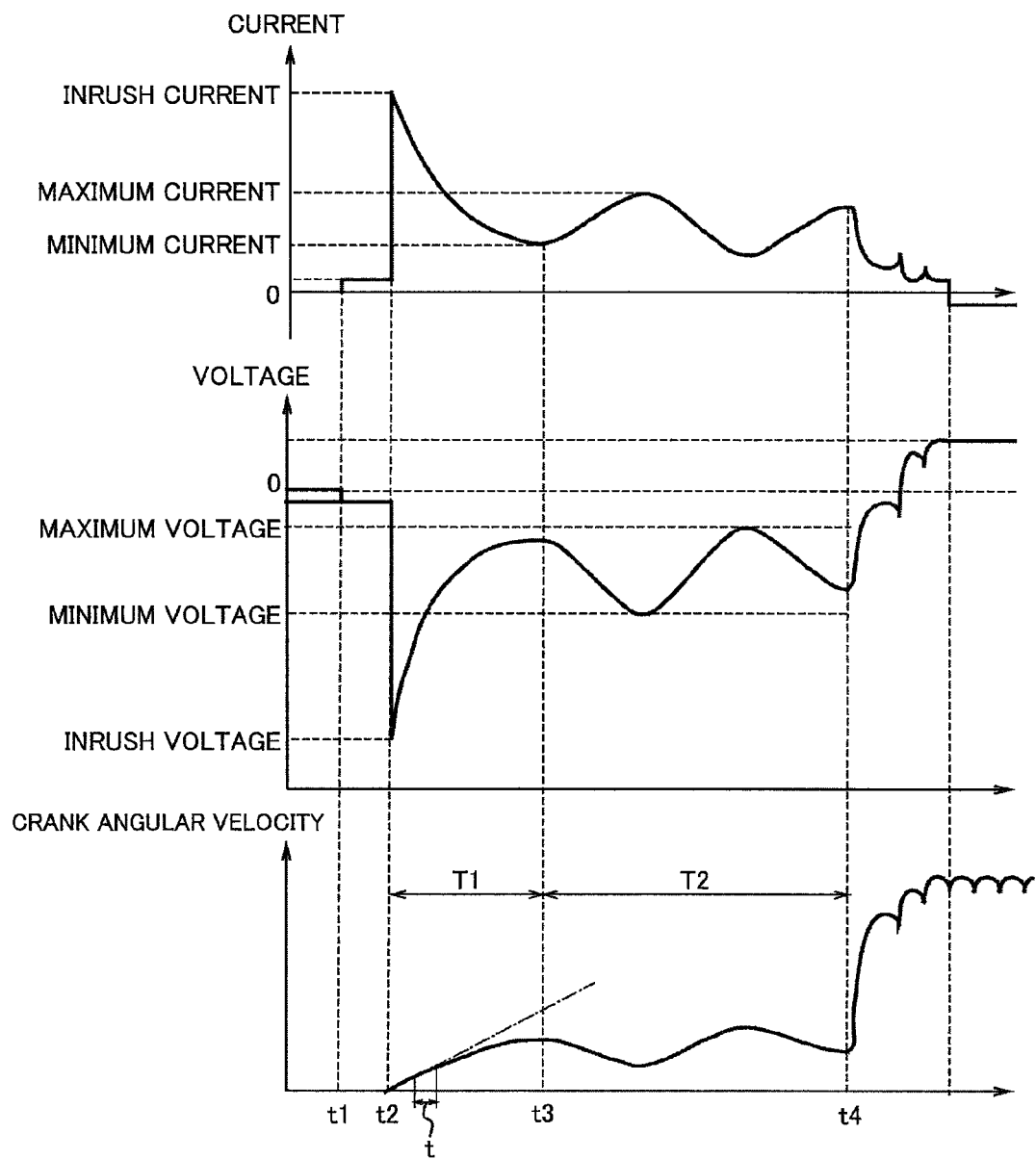
FIG. 4 is a graph showing a crank angle velocity and a current conductive state of a battery which change with a passage of time, during starting of an engine.
Figure 5:
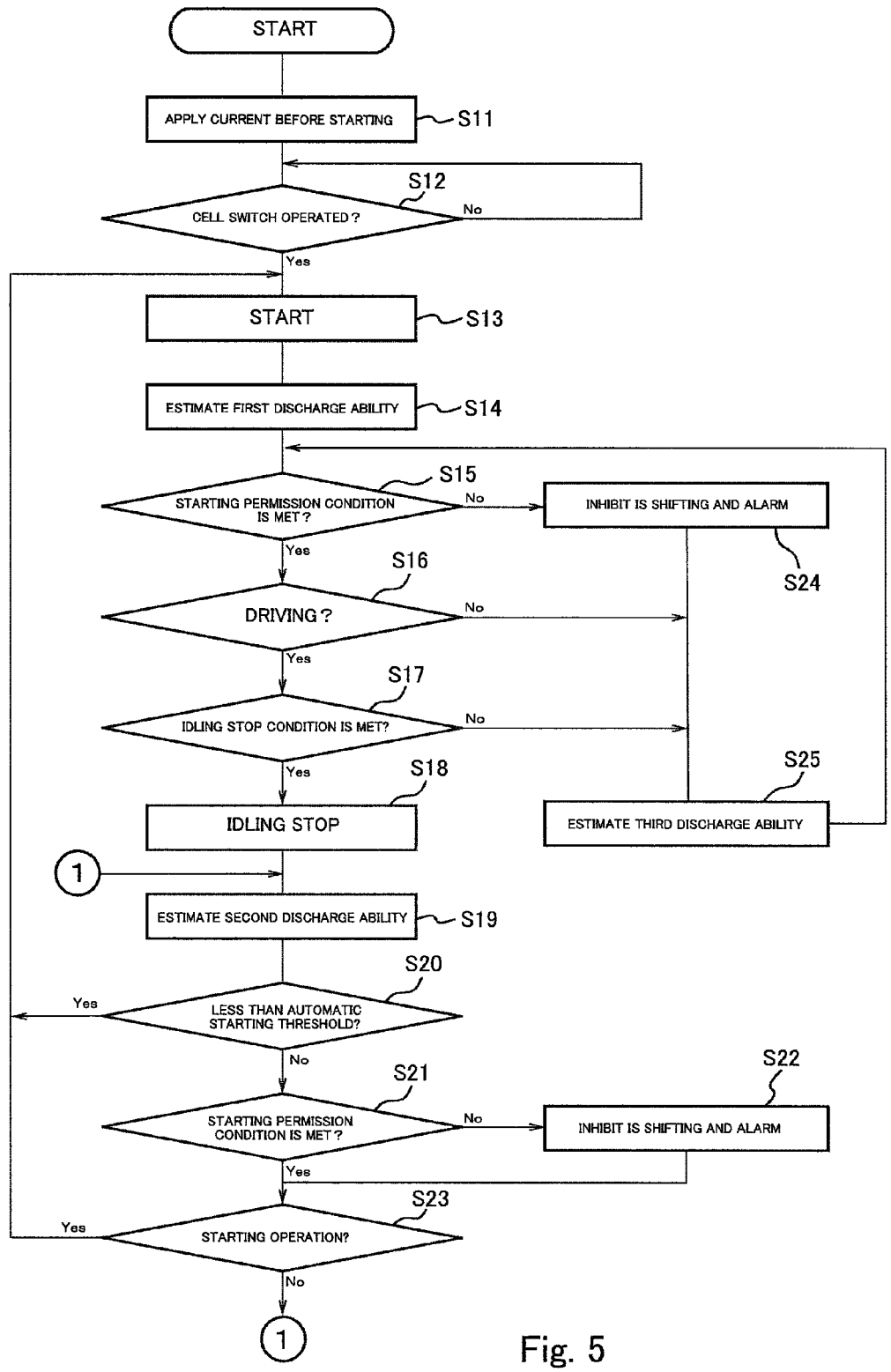
FIG. 5 is a flowchart showing a procedure of a method of stopping idling which is executed by the engine ECU of FIG. 1.

Referring to FIG. 5, when the main switch 38 is operated by the driver, in step S11, the engine ECU 40 applies a current before starting to electric devices (not shown) (see time t1 in FIG. 4). Then, the process moves to step S12. In step S12, the engine control section 41 in the engine ECU 40 determines whether or not the cell switch 39 has been operated by the driver. If it is determined that the cell switch 39 has not been operated, the engine control section 41 repeats determination until the cell switch 39 is operated by the driver. On the other hand, if it is determined that the cell switch 39 has been operated, the process moves to step S13 (starting step). In step S13, the motor control section 47 drives the electromagnetic on-off device 25 in response to the command from the engine control section 41 to cause the battery 21 to discharge the inrush current (see time t2 in FIG. 4). Thus, the motor 23 starts and the crankshaft 19 starts to rotate. When the motor 23 starts and the piston 18 moves, the process moves to step S14 (first discharge ability estimating step).

In step S14, the dischargeable current of the battery 21 is estimated based on the above stated discharge ability estimating method. After the dischargeable current is estimated, the process moves to step S15 (starting determination step). In step S15, the engine ECU 40 determines whether or not the dischargeable current meets a starting permission condition. The starting permission condition is such that the battery 21 has an adequate discharge ability to start the engine E.

In the present embodiment, the idling stop determiner section 43 in the engine ECU 40 determines that the starting permission condition is met, if the dischargeable current is equal to or greater than a predetermined shifting inhibiting threshold. Since in an initial period of the rotation starting period, the angular acceleration state of the crankshaft 19 corresponds to the current, and the voltage difference corresponds to the discharge continuation ability, the idling stop determiner section 43 determines whether or not the starting permission condition of the motor 23 is met using the angular acceleration state of the crankshaft 19, or the voltage difference in the initial period of the rotation starting period. After it is determined that the starting permission condition is met and the motor 23 can be effectively started, the process moves to step S16 (driving determination step).

In step S16, the idling stop determiner section 43 determines whether or not the motorcycle 1 is in a stopped state. The idling stop determiner section 43 determines whether or not the motorcycle 1 is driving based on, for example, the detection signal from at least one of the front wheel speed sensor 52 and the rear wheel speed sensor 53 which is input to the electric braking ECU 51. If it is determined that the motorcycle 1 is in a stopped state, the process moves to step S17 (idling step determination step). In step S17, the idling stop determiner section 43 determines whether or not the idling stop condition is met. As used herein, the idling stop condition is a condition used to stop the idling, and may be such that a transmission gear position is a neutral position, a brake lever (not shown) is operated or a brake pedal (not shown) is depressed (pressed down) by the driver. If it is determined that the idling stop condition is met, the process moves to step S18 (idling stop step).

In step S18, the engine control section 41 stops the idling of the engine E. After the idling is stopped, the idling stop determiner section 43 turns ON an idling stop (IS) active flag and the process moves to step S19 (second discharge ability estimating step).

In step S19, a present dischargeable current of the battery 21 (i.e., dischargeable current of the battery 21 at a current (i.e., present) time) is roughly estimated. Specifically, the discharge ability estimating section 42 estimates the amount of electric power discharged by the battery 21 during the idling stop, based on electric power consumption of the battery 21 per unit time during the idling stop and an idling stop time which are stored in the memory 48. Then, the discharge ability estimating section 42 estimates the present dischargeable current of the battery 21 based on the estimated electric power amount and the previously estimated dischargeable current of the battery 21. In the present embodiment, the discharge ability estimating section 42 estimates the present dischargeable current of the battery 21 by subtracting the estimated discharge amount during the idling stop from the electric power amount estimated from the previously estimated dischargeable current of the battery 21. After the present discharge ability of the battery 21 is estimated, the process moves to step S20 (automatic starting determination step).

In step S20, it is determined whether or not the present dischargeable current of the battery 21 estimated in step S19 is less than a predetermined badness threshold. If the dischargeable current is equal to or less than the badness threshold, the crankshaft 19 may probably be unable to rotate by the motor 23 under a state in which the motor 23 is supplied with the electric power only from the battery 21. If it is determined that the estimated dischargeable current is equal to or greater than the badness threshold, the process moves to step S21 (starting determination step).

In step S21, it is determined whether or not the present dischargeable current of the battery 21 meets the starting permission condition. If it is determined that the starting permission condition is not met and therefore the motor 23 cannot start depending on the running state of the engine E thereafter, the process moves to step S22 (IS shifting alarm step). In step S22, the idling stop determiner section 43 turns ON a flag for inhibiting next IS shifting, and the alarm display device 54 lights up to present to the driver, information indicating that the dischargeable current of the battery 21 is less and the next IS shifting is inhibited. In step S22, in the state in which the flag is turned ON, the electric braking ECU 51 inhibits the electric brake system 50 from starting in response to the above stated command, thereby suppressing electric power consumption in the battery 21. After the IS shifting has been inhibited and the starting of the electric brake system 50 has been inhibited, the process moves to step S23 (starting operation determination step). On the other hand, if it is determined that the starting permission condition is met and therefore the motor 23 can start well in step S21, the process moves to step S23.

In step S23, it is determined whether or not a starting initiation condition is met. The starting initiation condition may be such that the clutch lever 8 has been operated by the driver, or the brake lever and the brake pedal have not been operated (e.g., displaced or depressed) by the driver. If it is determined that the starting initiation condition is met, the process returns to step S13 to start the engine E. Then, after starting is initiated, the process moves to step S14, and the discharge ability estimating section 42 estimates a more correct dischargeable current again in the first discharge ability estimating step. On the other hand, if it is determined that starting initiation condition is not met in step S23, the process returns to step S19 to roughly estimate a present dischargeable current.

If it is determined that the starting initiation condition is not met in step S15 and therefore the motor 23 will not be able to start depending on the running state of the engine E thereafter, the process moves to step S24 (IS shifting inhibiting step). In step S24, the idling stop determiner section 43 turns ON a flag for inhibiting the IS shifting, and the engine control section 41 is caused to deactivate the idling stop function. The idling stop determiner section 43 lights up the alarm display device 54 to present to the driver information indicating that the dischargeable current of the battery 21 is less and the IS shifting is inhibited. In addition, the electric braking ECU 51 inhibits starting of the electric brake system 50. After the IS shifting has been inhibited and starting of the electric brake system 50 has been inhibited, the process moves to step S25 (third discharge ability estimating step).

In step S25, a dischargeable current of the battery 21 during running of the engine E is estimated. The discharge ability estimating section 42 estimates an amount of electric power charged in the battery 21 based on a predetermined charge amount of the battery 21 per unit time, corresponding to each operation pattern (driving, idling stop, etc.), and a continuation time of each operation pattern. The discharge ability estimating section 42 calculates and estimates, again, a present dischargeable current of the battery 21 based on the estimated electric power amount and the previously estimated dischargeable current of the battery 21. In the present embodiment, the present dischargeable current is estimated roughly by adding the charge amount estimated for each operation pattern to the remaining electric power amount estimated from the previously estimated dischargeable current of the battery 21. After the present dischargeable current is estimated, the process returns to step S15, and it is determined whether or not the starting permission condition is met.

In a case where it is determined whether or not the starting permission condition is met in the state in which the IS shifting inhibiting flag is turned ON, a shifting inhibiting threshold which is a determination criterion used to determine whether or not the starting permission condition is met, is set as an IS permission threshold higher than a value in the case where the IS shifting inhibiting flag is not turned ON. In step S15, it is determined whether or not the starting permission condition is met based on the IS permission threshold. If it is determined that the starting permission condition is not met, the process moves to step S24, and the state in which the IS shifting inhibiting flag is turned ON, is maintained. On the other hand, if it is determined that the starting permission condition is met, the IS shifting inhibiting flag is turned OFF, and the process moves to step S16.

If it is determined that the motorcycle 1 is driving in step S16, or it is determined that the idling stop condition is not met in step S17, the process moves to step S25. In step S25, the discharge ability estimating section 42 estimates an amount of electric power charged in the battery 21 based on a predetermined charge amount of the battery 21 per unit time, during driving, and a continuation time of the driving. Then, the discharge ability estimating section 42 calculates and estimates, again, a present dischargeable current of the battery 21 based on the estimated electric power amount and the previously estimated dischargeable current of the battery 21. After the estimation, the process returns to step S15, and it is determined whether or not the starting permission condition is met.

In the motorcycle 1 having the above stated idling stop function, when the main switch 38 is turned OFF, the engine E stops running, and the idling stop method terminates.

Figure 6:
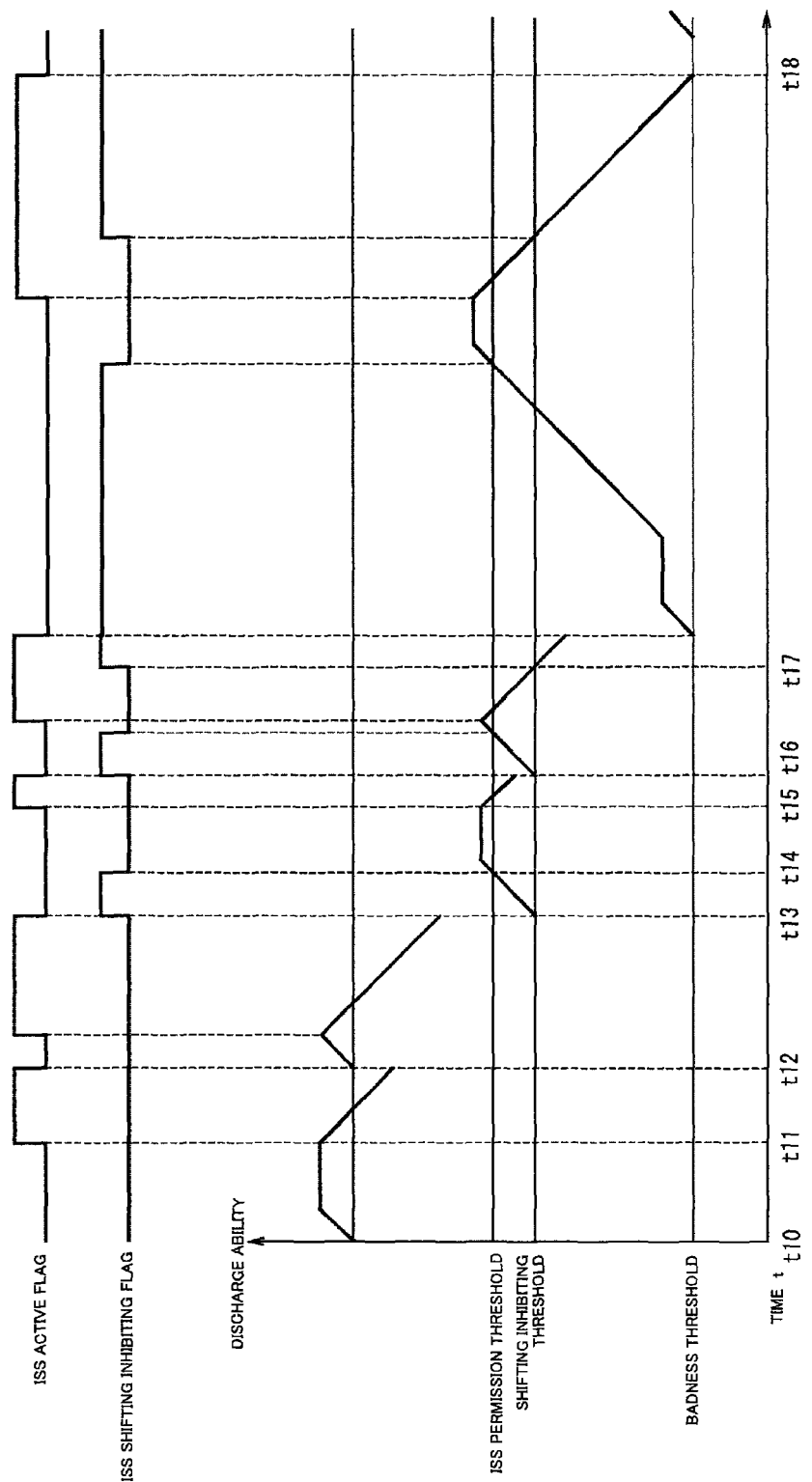
FIG. 6 is a graph showing a time-series change in determination as to charging and discharging of the battery during driving of the motorcycle.

Hereinafter, a description will be given of a case where the above stated idling stop method is specifically applied, in conjunction with the example shown in FIG. 6. The dischargeable current of the battery 21 is sufficient in amount in an initial period before starting of the engine E, i.e., the value of dischargeable current of the battery 21 is much higher than the IS shifting inhibiting threshold. When the engine E starts in step S13, in step S14, the dischargeable current of the battery 21 is estimated by the discharge ability estimating method (time t10). Thereafter, during driving, a charge amount of the battery 21 is calculated according to the operation pattern in step S25, and the value corresponding to the calculated charge amount is added to the previously estimated dischargeable current of the battery 21. In this way, the present dischargeable current of the battery 21 is estimated roughly (time t10~time t11).

When it is determined that the motorcycle 1 is in a stopped state in step S16 and the idling stop operation is performed, the IS active flag is turned ON to stop the idling in step S18 (time t11). In step S19, the discharge ability estimating section 42 calculates an amount of electric power discharged by the idling stop, and subtracts a value corresponding to this electric power amount from the previously estimated dischargeable current of the battery 21, thus roughly estimating the present dischargeable current of the battery 21 (time t11~time t12). Then, if the starting initiation condition is met during the idling stop in step S23, the process returns to step S13 and the engine E starts (time t12). After the engine E starts, the discharge ability estimating section 42 estimates the dischargeable current of the battery 21 again by the discharge ability estimating method in step S14. And, the estimated dischargeable current of the battery 21 is used as the present dischargeable current of the battery 21.

As described above, the discharge ability estimating section 42 roughly estimates the present dischargeable current of the battery 21, using the first discharge ability estimating step and the second discharge ability estimating step in which the amount of electric power stored in the battery 21 is added to the remaining electric power amount, or the discharged electric power amount is subtracted from the remaining electric power amount, based on the dischargeable current estimated in the first discharge ability estimating step. Based on the roughly estimated dischargeable current of the battery 21, it is determined whether to continue or stop the idling. This makes it possible to avoid a situation in which the dischargeable current of the battery 21 continues to decrease and thereby the motor 23 will not be able to start, during a period in which estimation of the dischargeable current by the first discharge ability estimating step is not performed.

If it is determined that the dischargeable current of the battery 21 estimated at the starting does not meet the starting permission condition (the value of the dischargeable current of the battery 21 is equal to or greater than the IS shifting inhibiting threshold) in step S15, after the idling stop is repeated, in step S24, the idling stop determiner section 43 turns ON the IS shifting inhibiting flag and the engine control section 41 is caused to deactivate the idling stop function (time t13). In the state in which the IS shifting inhibiting flag is ON, the electric braking ECU 51 inhibits the actuation of the electric brake system 50 to suppress electric power consumption in the battery 21. This makes it possible to avoid a situation in which the dischargeable current of the battery 21 is lessened because of the actuation of the electric brake system 50, and thereby the motor 23 will not be able to start in the idling stop state.

In step S25, the present dischargeable current of the battery 21 is estimated (time t13~time t14). If it is determined that the estimated present dischargeable current of the battery 21 meets the starting permission condition (the value of the dischargeable current of the battery 21 is equal to or greater than the IS shifting inhibiting threshold), in step S15, the IS shifting inhibiting flag is turned OFF in step S24 (time t14). That is, at the time point when the dischargeable current of the battery 21 is restored, the electric brake system 50 is permitted to be actuated. Then, if it is determined that the motorcycle 1 is in a stopped state and the idling stop operation is performed, the IS active flag is turned ON and the idling stop is activated again in step S18 (time t15).

If it is determined that the estimated dischargeable current of the battery 21 does not meet the starting permission condition (the value of the dischargeable current of the battery 21 is equal to or greater than the shifting inhibiting threshold), at the starting, the IS shifting inhibiting flag is turned ON and the engine control section 41 is caused to deactivate the idling stop function (time t16). In the middle of the IS, if it is determined that the present dischargeable current of the battery 21 does not meet the starting permission condition (the value of the dischargeable current of the battery 21 is equal to or greater than the shifting inhibiting threshold), in step S21, the IS shifting inhibiting flag is turned ON in step S22 and the alarm display device 54 presents to the driver the information indicating that the IS shifting is inhibited (time t17). In the middle of the IS, if it is determined that the value of the present dischargeable current of the battery 21 is equal to or less than the predetermined badness threshold in step S20, the process returns to step S13 and the engine E is started automatically (time 18).

As should be appreciated from the above, if the value of the present dischargeable current of the battery 21 becomes equal to or less than the predetermined badness threshold, in the middle of the IS, the engine ECU 40 deactivates the idling stop function and the engine E is started automatically, before the motor 23 will not be able to start. This make it possible to prevent the motor 23 from failing to start after the IS is executed.

Although the above described idling stop method uses the dischargeable current, it may use the discharge continuation ability instead of the dischargeable current.

[Another Idling Stop Method]

Figure 7:
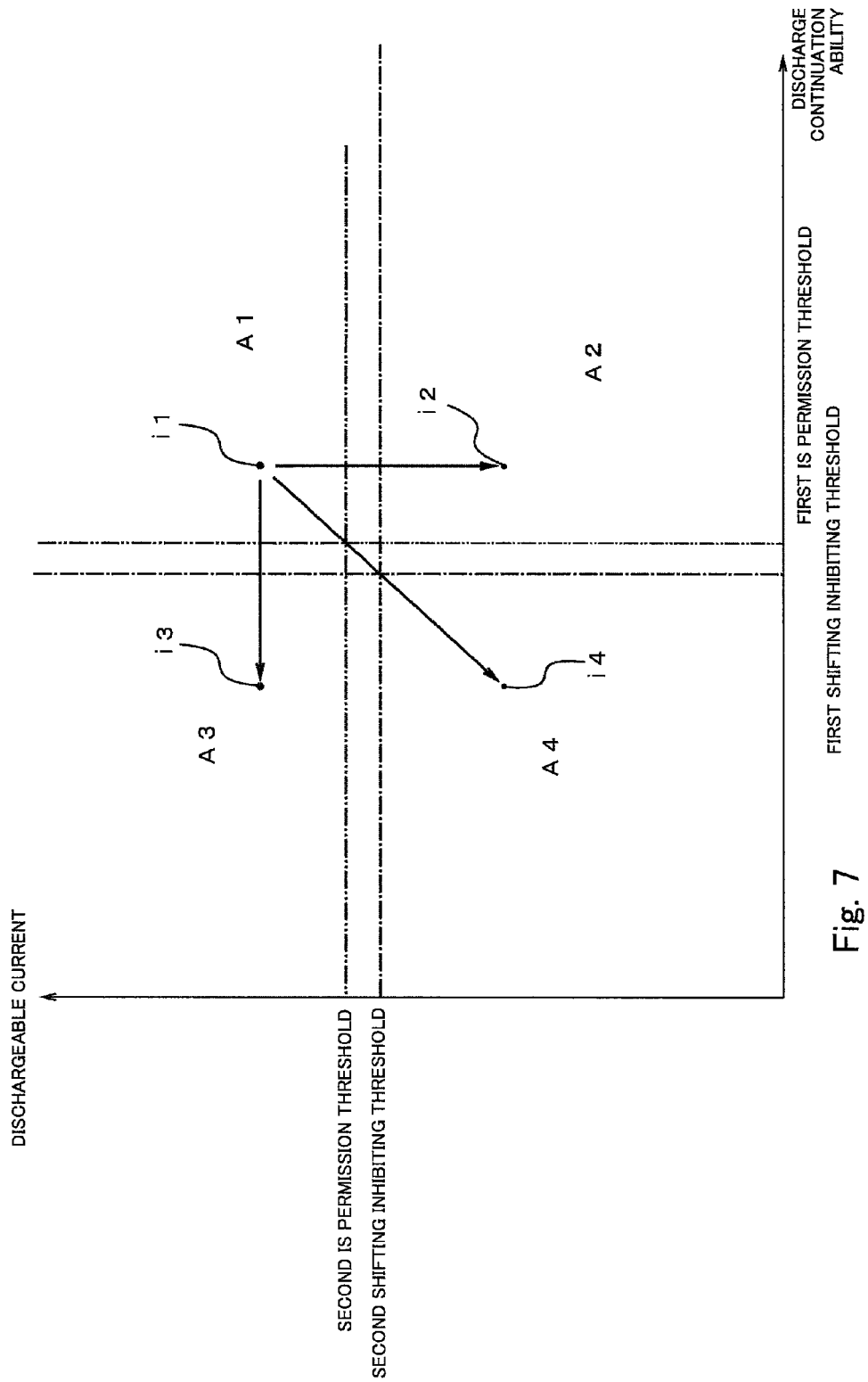
FIG. 7 is a graph showing a relation between a dischargeable current and a discharge continuation ability of the battery, and a battery state.

Although the above described idling stop method uses only the dischargeable current, it may use both the dischargeable current and the discharge continuation ability. Hereinafter, another idling stop method using two discharge abilities will be described with reference to FIG. 7. In another idling stop method, the state of the battery 21 is estimated based on a graph shown in FIG. 7, and it is determined whether the idling stop is performed or the motor 23 is automatically started to forcibly start the engine E based on the estimated state of the battery 21. The other steps are identical to those of the above described idling stop method. In the graph shown in FIG. 7, a horizontal axis indicates a discharge continuation ability (inverse number of voltage difference) and a vertical axis indicates a dischargeable current.

This graph contains four ranges which are: a good range A1, a first caution range A2, a second caution range A3, and a bad range A4. The good range A1 is a range in which the discharge continuation ability (inverse number of voltage difference) of the battery 21 is equal to or greater than a predetermined first shifting inhibiting threshold, and the dischargeable current is equal to or greater than a predetermined second shifting inhibiting threshold. The first caution range A2 is a range in which the discharge continuation ability is equal to or greater than the predetermined first shifting inhibiting threshold, and the dischargeable current is less than the predetermined second shifting inhibiting threshold. The second caution range A3 is a range in which the discharge continuation ability is less than the predetermined first shifting inhibiting threshold, and the dischargeable current is equal to or greater than the predetermined second shifting inhibiting threshold. The bad range A4 is a range in which the discharge continuation ability is less than the predetermined first shifting inhibiting threshold, and the dischargeable current is less than the predetermined second shifting inhibiting threshold. The engine ECU 40 estimates the state of the battery 21 depending on which of the four ranges A1 to A4 an intersection of the estimated discharge ability and the estimated dischargeable current lies in.

Specifically, if the intersection is present in the good range A1 (see intersection i1 in FIG. 7), the battery 21 is in a good state, and the idling stop determiner section 43 determines that the starting permission condition is met. If the idling stop condition is met in a stopped state of the motorcycle 1, the engine control section 41 stops the idling of the engine E.

If the state of the battery 21 turns to bad, and the intersection falls in the first caution range A2 (see intersection i2 in FIG. 7) or the second caution range A3 (see i3 in FIG. 7), it is more likely that the motor 23 will not be able to start by the electric power supplied from the battery 21, and the idling stop determiner section 43 determines that the starting permission condition is not met. Thereupon, as in the case at a time t13 shown in FIG. 6, the idling stop determiner section 43 turns ON the IS shifting inhibiting flag, and the engine control section 41 is caused to deactivate the idling stop function.

Once the IS shifting inhibiting flag is turned ON, the good range A1 is narrowed until the IS shifting inhibiting flag is turned OFF (withdrawn). Specifically, the good range A1 changes into a range in which the discharge continuation ability (voltage difference) is greater than a predetermined first IS permission threshold (>first shifting inhibiting threshold) and the dischargeable current is equal to or greater than a predetermined second IS permission threshold (>second shifting inhibiting threshold) (see two-dotted line in FIG. 7). This makes it possible to prevent the IS shifting inhibiting flag from rising (turning ON) and falling (turning OFF) frequently.

If the state of the battery 21 worsens and the intersection falls in the bad range A4 (see intersection i4 in FIG. 7), the idling stop determiner section 43 determines that the battery 21 is in a bad state. Therefore, the engine control section 41 automatically starts the engine E. If the state of the battery 21 turns to good by, for example, charging of the battery 21, and the intersection falls in the good range A1 again, after the battery 21 has worsened, the idling stop determiner section 43 determines that the battery 21 is in a good state. If the idling stop condition is met during a stopped state of the motorcycle 1, the engine control section 41 stops the idling of the engine E.

In accordance with this idling stop method, since the estimated two discharge abilities (indicators) are used, the state of the battery 21 can be determined more accurately as compared to a case where only the estimated discharge ability is used, and the result of determination may be utilized to determine whether or not to execute the idling stop. This can suppress the motor 23 from failing to start after the idling stop.

[Other Embodiments]

Although in the present embodiment, the crank angle sensor 35 detects the rotational angle of the crankshaft 19, the rotational angle of the crankshaft 19 may be detected using a sensor other than the crank angle sensor 35. For example, the angular acceleration of the crankshaft 19 may be derived from the rotational angle of a rotary member which is rotatable together with the crankshaft 19, the output shaft of the motor 23, etc. Although the engine temperature is estimated based on the detection signal from the water temperature sensor 36, it may be estimated based on the detection signal from another temperature sensor, for example, the existing temperature sensor for measuring a temperature of lubricating oil, an engine case, intake air, or exhaust air. Preferably, a temperature sensor for use in engine control may be used.

Although in the present embodiment, the electric brake system 50 is exemplarily described as the electric device, the electric devices may be electric devices which do not directly relate to driving, such as accessory electric power supplies associated with a grip heater, audio, a navigation system, or a windshield. The electric devices such as the engine ECU 40, an actuator required to control the engine E, a light-up device, etc., which directly relate to driving of the motorcycle 1, are configured not to be deactivated for a continued period of time, even when the IS shifting inhibiting flag is turned ON. Further, if the charge amount of the battery 21 is less, the engine E may be controlled to generate more electric power. For example, the engine speed during the idling may be increased. In the present embodiment, values of actual charge/discharge current may be measured instead of estimating the charge/discharge amount from the operation pattern, and the charge/discharge amount of the battery 21 may be calculated by integrating (summing up) the actual measurement values.

Although in the present embodiment, the angular acceleration state of the crankshaft 19 is represented by a rotation time required for the crankshaft 19 to rotate over the two angular positions, it may be an angular acceleration of the crankshaft 19 during starting or after a passage of a predetermined time after a starting time, an angular velocity of the crankshaft 19 after a passage of a predetermined time just after the starting, a velocity difference between two angular positions, etc. Although the rotational starting period is a predetermined period from when the crankshaft 19 starts until the crankshaft 19 rotates by the engine driving power, it may be a predetermined period which passes immediately after the engine ECU 40 starts the crankshaft 19 until one of the pistons 18 reaches a bottom dead center, or a predetermined period which passes before the fuel is ignited. The rotation starting period may be set to a very short time (e.g., time within 0.5 second just after the motor starting command is given to the motor 23) during which the inrush current is flowing in the motor 23 just after the motor starting command is given to the motor 23. The starting time period T1 may be set to a time when the inrush current or the inrush voltage will be applied to the motor 23. The time period T2 before ignition may be set to a period which is present after the starting time period T1 and one of the pistons 18 reaches the bottom dead center, or a period which passes before the fuel is ignited.

Although in the present embodiment, the inverse number of the voltage difference between the minimum voltage and the maximum voltage in the time period T2 before ignition is calculated as the discharge continuation ability, both of the minimum voltage and the maximum voltage need not be used. One of the minimum voltage and the maximum voltage may be replaced by, for example, the voltage (i.e., closed circuit voltage) of the battery 21 before the main switch 38 is operated, or a voltage (voltage before starting, time t1 in FIG. 4) of the battery 21 when a current before starting is flowed in the electric device after the main switch 38 is operated. The influence of the polarization of the battery 21 can be cancelled by using these voltages. Instead of the inverse number of the voltage difference, a voltage difference may be simply used.

Although in the discharge ability estimating method of the present embodiment, both of the dischargeable current and the discharge continuation ability are estimated, only one of them may be estimated. Compensation may be made for the estimated discharge ability, based on parameters other than the engine temperature and the battery temperature. Since an electromagnetic force changes depending on the state of charge (SOC) of the battery 21, compensation may be made for the discharge ability based on the voltage before starting corresponding to the SOC of the battery 21.

Although in the above embodiment, the discharge continuation ability is estimated and the state of the battery 21 is estimated, based on the difference between the maximum voltage and the minimum voltage in the time period T2 before ignition, they may not be estimated based on the voltage difference between the maximum voltage and the minimum voltage. In a case where the discharge continuation ability is lower depending on the state of the battery 21, the maximum voltage and the minimum voltage fluctuate. Therefore, the discharge continuation ability can be estimated and the state of the battery 21 can be estimated by detecting at least one of the maximum voltage and the minimum voltage.

Although in the present embodiment, the first angle α used to calculate the angular acceleration state of the crankshaft 19 is predetermined, it may be set to an angle immediately before starting of the engine E. A great difference in the angular acceleration state, which depends on the discharge ability of the battery 21, is noticeably observed immediately after the motor 23 starts. By setting the first angle α to an angle immediately before the engine E starts, as described above, a dischargeable current of the battery 21, including the discharge ability corresponding to this great difference in the angular acceleration state, can be estimated. This allows the discharge ability of the battery 21 to be estimated more accurately as compared to a prior art technique in which the inrush current just after starting cannot be measured accurately.

Although in the present embodiment, the engine ECU 40 estimates the two discharge abilities of the battery 21, another calculating section may estimate the discharge abilities. Although in the present embodiment, compensation is made for the estimated discharge ability based on the engine temperature and the air intake temperature to eliminate the mechanical resistance influence of the engine E, it may be performed depending on degradation progressing over time (decrease in the mechanical resistance which is caused by an increased clearance due to wear-out, or decrease in the mechanical resistance due to unevenness of a wall surface), the activated/deactivated state of the generator 20, or a stroke (compression stroke and expansion stroke) of the piston 18, if the degree of the influences of the mechanical resistance according to another criterion can be determined. Although in the present embodiment, compensation is made for the estimated discharge ability, compensation may be made for a threshold used to determine whether or not to stop the idling or whether or not to initiate automatic starting of the engine E. Thus, in the present embodiment, compensation of the discharge ability may include compensation of the threshold.

Although in the present embodiment, the idling stop function is deactivated and the actuation of the electric brake system 50 is inhibited in the state in which the IS shifting inhibiting flag is turned ON, the actuation of the electric brake system 50 may be inhibited when an actuation inhibiting flag different from the IS shifting inhibiting flag is turned ON. In this case, preferably, a threshold used for rising (turning ON) or falling (turning OFF) the actuation inhibiting flag is set higher than the value of the IS shifting inhibiting flag, and is turned ON before the IS shifting inhibiting flag is turned ON. This can avoid a situation in which the electric brake system 50 is activated after the IS shifting inhibiting flag is turned ON and the idling stop function continues to be deactivated.

Although in the present embodiment, the motorcycle 1 includes the electric brake system 50 and the electric braking ECU 51, they may be omitted from the motorcycle 1. Although in the present embodiment, the second and third discharge ability estimating steps are performed to estimate the present discharge ability of the battery 21 after the engine E starts, these steps may be omitted. Although in the present embodiment the engine ECU 40 of the motorcycle 1, including the in-line four-cylinder engine E, has been described, the engine E may include a single cylinder, two cylinders, three cylinders, or four or more cylinders, or may be a two-cycle engine. In addition, the attitude and layout of the cylinders 14 are not limited to those described above. The engine E included in the motorcycle 1 is not limited to a gasoline engine but may be an internal combustion engine, such as a diesel engine.

Although in the present embodiment, an example in which the present invention is applicable to the motorcycle 1, the present invention is applicable to vehicles such as straddle-type vehicles (e.g., ATV), or vehicles such as four-wheeled vehicles. In particular, the present invention is applicable to a vehicle having a smaller width and a smaller battery capacity, such as a straddle-type vehicle or a vehicle including a handle lever.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A discharge ability estimating device for estimating dischargeable current which is dischargeable from a battery for supplying electric power to an electric motor which rotates a crankshaft of an engine to start the engine, the discharge ability estimating device comprising:
    a sensor for detecting a rotational angle of the crankshaft; and
    a controller for calculating an angular acceleration of the crankshaft in a rotation starting period of the crankshaft based on the rotational angle detected by the sensor, and for estimating the dischargeable current of the battery based on the angular acceleration.

2. The discharge ability estimating device according to claim 1,
    wherein the sensor is configured to detect the rotational angle of the crankshaft, irrespective of a current value when the electric motor is started.

3. The discharge ability estimating device according to claim 1,
    wherein compensation is made for the estimated dischargeable current of the battery based on an engine temperature or an outside air temperature.

4. The discharge ability estimating device according to claim 1,
    wherein discharge continuation ability of the battery is estimated based on at least one of a maximum value and a minimum value of a value corresponding to a current or voltage supplied from the battery to the electric motor, the value corresponding to the current or the voltage being in a second time period except for a first time period just after the electric motor starts during cranking of the engine.

5. The discharge ability estimating device according to claim 4,
    wherein discharge continuation ability of the battery is estimated based on a difference between the maximum value and the minimum value of the value corresponding to the current or voltage in the second time period.

6. The discharge ability estimating device according to claim 1,
    wherein compensation is made for the estimated dischargeable current of the battery based on a battery temperature.

7. The discharge ability estimating device according to claim 1, wherein the controller estimates that the dischargeable current of the battery is greater as the calculated angular acceleration of the crankshaft is greater.

8. The discharge ability estimating device according to claim 1, further comprising:
    an alarm display device which lights up to present alarm information;
    wherein the controller determines whether or not the estimated dischargeable current is equal to or greater than a predetermined threshold, and causes the alarm display device to light up, when the controller determines that the estimated dischargeable current is less than the predetermined threshold.

9. The discharge ability estimating device according to claim 1,
    wherein the controller determines whether or not the estimated dischargeable current is equal to or greater than a predetermined threshold, and controls the electric motor actuated by electric power supplied from the battery to lessen an electric power consumption amount of the battery, when the controller determines that the estimated dischargeable current is less than the predetermined threshold.

10. The discharge ability estimating device according to claim 1,
    wherein the controller estimates a present dischargeable current of the battery based on the dischargeable current estimated in a rotation starting period of the crankshaft and charged and discharged states of the battery which change after the crankshaft starts rotating.

11. The discharge ability estimating device according to claim 1,
    wherein the controller estimates an amount of electric power charged in the battery based on a charge amount of the battery per unit time, corresponding to each operation pattern, and continuation time of each operation pattern; and
    the controller estimates a present dischargeable current of the battery based on the estimated electric power amount and the dischargeable current estimated previously.

12. The discharge ability estimating device according to claim 1,
    an electric generator mounted to the crankshaft of the engine, for generating electric power by rotation of the crankshaft, to charge the battery;
    wherein the controller determines whether or not the estimated dischargeable current is equal to or greater than a predetermined threshold, and causes the engine to increase an amount of the electric power generated in the electric generator, when the controller determines that the estimated dischargeable current is less than the predetermined threshold.

13. A control apparatus in a vehicle, the control apparatus comprising:
    a discharge ability estimating device for estimating a discharge ability of a battery for supplying electric power to an electric motor which rotates a crankshaft of an engine to start the engine, the discharge ability estimating device being configured to estimate the discharge ability of the battery based on an angular acceleration state of the crankshaft in a rotation starting period of the crankshaft;
    an actuation determiner device for determining whether or not the electric motor can actuate the crankshaft by the electric power supplied from the battery, based on a result of estimation performed by the discharge ability estimating device;
    an electric generator for generating electric power by rotation of the crankshaft and supplies the electric power to the battery; and
    an operation control device which causes the engine to stop the rotation of the crankshaft during a stopped state of the vehicle, if it is determined that the crankshaft can be actuated, and causes the electric generator to supply the electric power to the battery without stopping the rotation of the crankshaft during the stopped state, if it is determined that the crankshaft cannot be actuated.

14. The control apparatus in the vehicle according to claim 13,
    wherein the actuation determiner device determines whether or not to stop an idling state, based on the discharge ability estimated by the discharge ability estimating device, and a charge or discharge state of the battery which changes from a time point when the discharge ability of the battery has been estimated by the discharge ability estimating device.

15. The control apparatus in the vehicle according to claim 13,
wherein the actuation determiner device compares a result of estimation performed by the discharge ability estimating device to a predetermined actuation determination criterion, to determine whether or not the electric motor can actuate the crankshaft, and makes compensation for the predetermined actuation determination criterion based on a battery temperature.

16. A control apparatus in a vehicle, the control apparatus comprising:
a discharge ability estimating device for estimating a dischargeable current which is dischargeable from a battery for supplying electric power to an electric motor which rotates a crankshaft of an engine to start the engine, the discharge ability estimating device being configured to estimate the dischargeable current of the battery based on an angular acceleration state of the crankshaft in a rotation starting period of the crankshaft;
an actuation determiner device for determining whether or not an electric device can be actuated by the electric power supplied from the battery, based on a result of estimation performed by the discharge ability estimating device; and
an actuation control device which actuates the electric device if the actuation determiner device determines that the electric device can be actuated, and does not actuate the electric device if the actuation determiner device determines that the electric device cannot be actuated.

17. The control apparatus in the vehicle according to claim 16,
wherein the actuation determiner device compares a result of estimation performed by the discharge ability estimating device to a predetermined actuation determination criterion, to determine whether or not the electric device can be actuated, and makes compensation for the predetermined actuation determination criterion based on a battery temperature.

18. A discharge ability estimating method for estimating a dischargeable current which is dischargeable from a battery for supplying electric power to an electric motor which rotates a crankshaft of an engine to start the engine, the method comprising:
calculating an angular acceleration of the crankshaft in a rotation starting period of the crankshaft based on a rotational angle of the crankshaft which is detected by a sensor; and
estimating the dischargeable current of the battery based on the angular acceleration.

* * * * *

UNITED STATES PATENT AND TRADEMARK OFFICE
CERTIFICATE OF CORRECTION

| | | |
|---|---|---|
| PATENT NO. | : 8,744,676 B2 | Page 1 of 1 |
| APPLICATION NO. | : 13/554974 | |
| DATED | : June 3, 2014 | |
| INVENTOR(S) | : Takuya Sakamoto et al. | |

It is certified that error appears in the above-identified patent and that said Letters Patent is hereby corrected as shown below:

In the Claims:

Col. 19, Line 38 in the Claim 5, on Line 3, insert --the-- between "wherein" and "discharge".

Signed and Sealed this
Ninth Day of September, 2014

Michelle K. Lee
*Deputy Director of the United States Patent and Trademark Office*